United States Patent
Kanno

(10) Patent No.: US 10,861,580 B2
(45) Date of Patent: Dec. 8, 2020

(54) MEMORY SYSTEM FOR CONTROLLING NONVOLATILE MEMORY

(71) Applicant: TOSHIBA MEMORY CORPORATION, Minato-ku (JP)

(72) Inventor: Shinichi Kanno, Ota (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 19 days.

(21) Appl. No.: 16/352,885

(22) Filed: Mar. 14, 2019

(65) Prior Publication Data
US 2019/0378591 A1 Dec. 12, 2019

(30) Foreign Application Priority Data

Jun. 6, 2018 (JP) ................. 2018-108591

(51) Int. Cl.
*G06F 12/10* (2016.01)
*G11C 29/00* (2006.01)

(52) U.S. Cl.
CPC .............. *G11C 29/76* (2013.01); *G06F 12/10* (2013.01); *G06F 2212/7201* (2013.01)

(58) Field of Classification Search
CPC ................... G06F 12/00; G06F 2212/7201
USPC ......................................................... 711/203
See application file for complete search history.

(56) References Cited

U.S. PATENT DOCUMENTS

| | | | |
|---|---|---|---|
| 8,095,765 B2 | 1/2012 | Asnaashari et al. | |
| 9,786,377 B2 * | 10/2017 | Bushnaq | G11C 16/0483 |
| 10,055,130 B2 * | 8/2018 | Kanno | G06F 3/0619 |
| 10,095,443 B2 * | 10/2018 | Kanno | G06F 3/0688 |
| 10,175,889 B2 * | 1/2019 | Aga | G06F 3/0611 |
| 2010/0325343 A1 * | 12/2010 | Takashima | G11C 29/88 |
| | | | 711/103 |
| 2012/0089767 A1 | 4/2012 | Lee et al. | |
| 2015/0067248 A1 * | 3/2015 | Yoo | G06F 11/00 |
| | | | 711/105 |
| 2015/0339223 A1 | 11/2015 | Matsudaira et al. | |
| 2017/0262175 A1 * | 9/2017 | Kanno | G06F 3/061 |
| 2018/0173420 A1 * | 6/2018 | Li | G06F 3/061 |

FOREIGN PATENT DOCUMENTS

JP    2009-199242    9/2009

* cited by examiner

*Primary Examiner* — Christopher B Shin
(74) *Attorney, Agent, or Firm* — Oblon, McClelland, Maier & Neustadt, L.L.P.

(57) ABSTRACT

According to one embodiment, a memory system controls a plurality of parallel access units each of which includes a plurality of blocks belonging to the different nonvolatile memory chips. The memory system stores information indicating address conversion rules prescribed such that the number of defective blocks included in the parallel access units is equal to or smaller than a first number. Each of the address conversion rules indicates a mathematical rule for converting a block address to be sent to each of the nonvolatile memory chips into another block address. An address conversion circuit in the memory system converts each of block addresses to be sent to each nonvolatile memory chip into another block address, based on each mathematical rule.

12 Claims, 13 Drawing Sheets

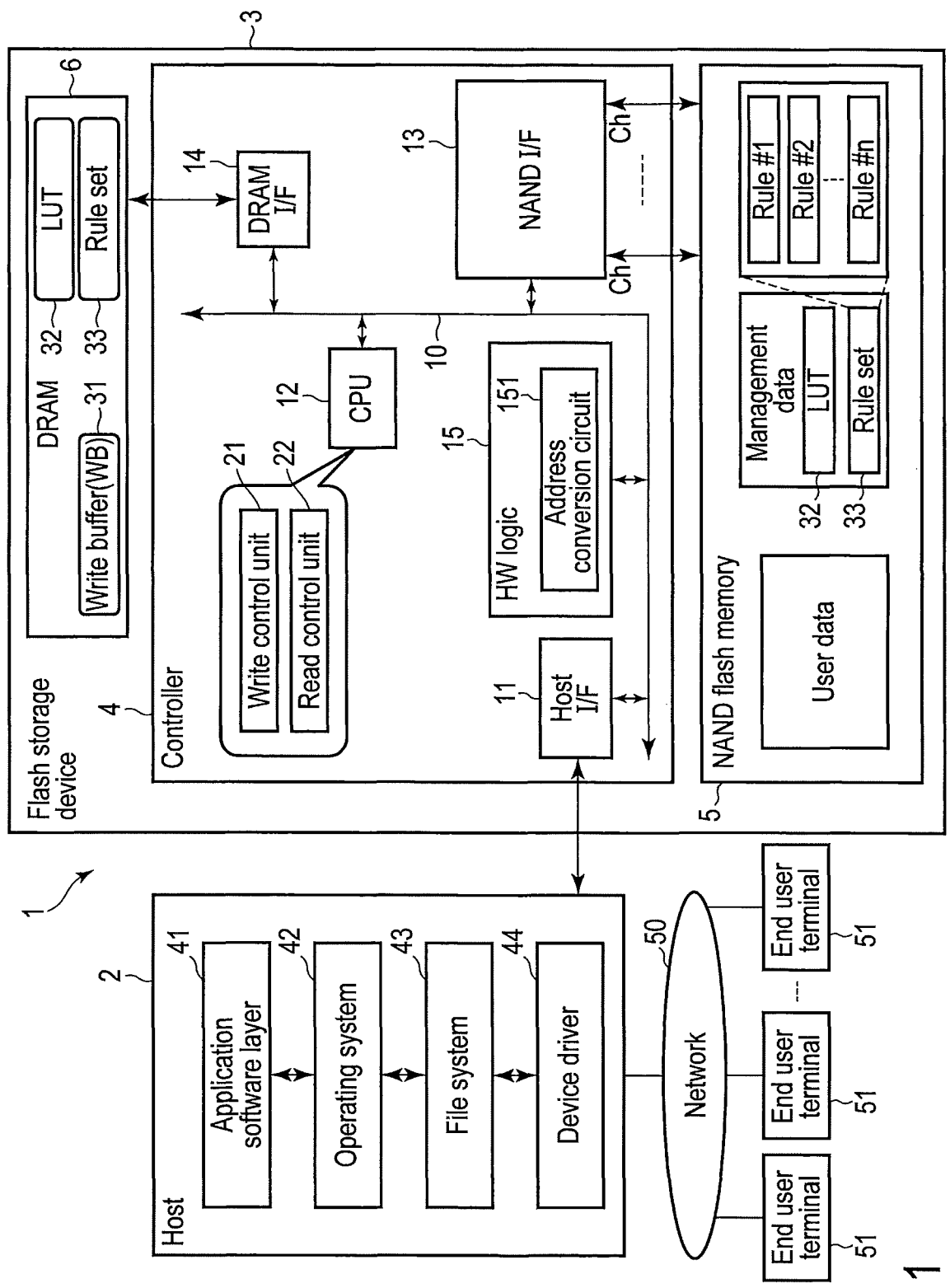
F I G. 1

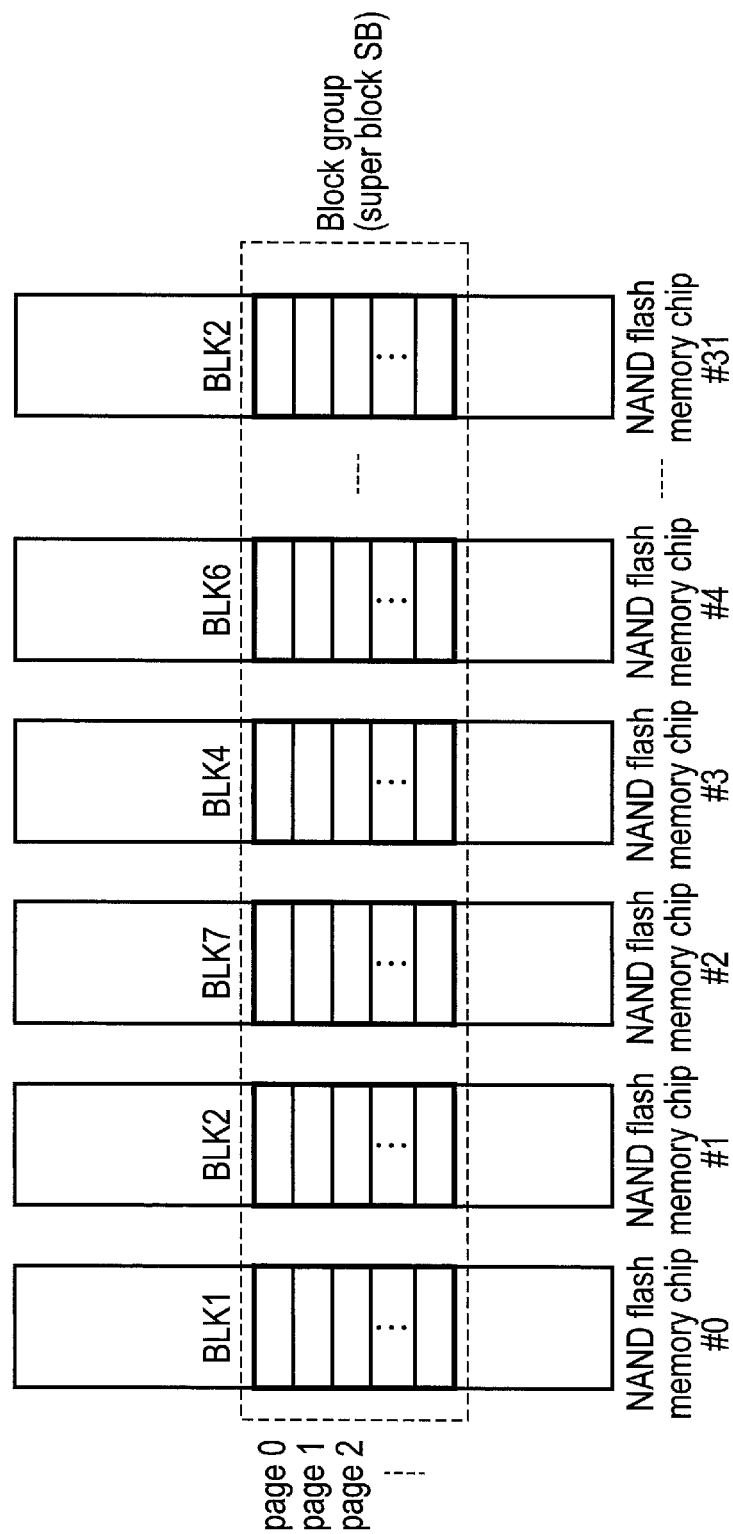
F I G. 5

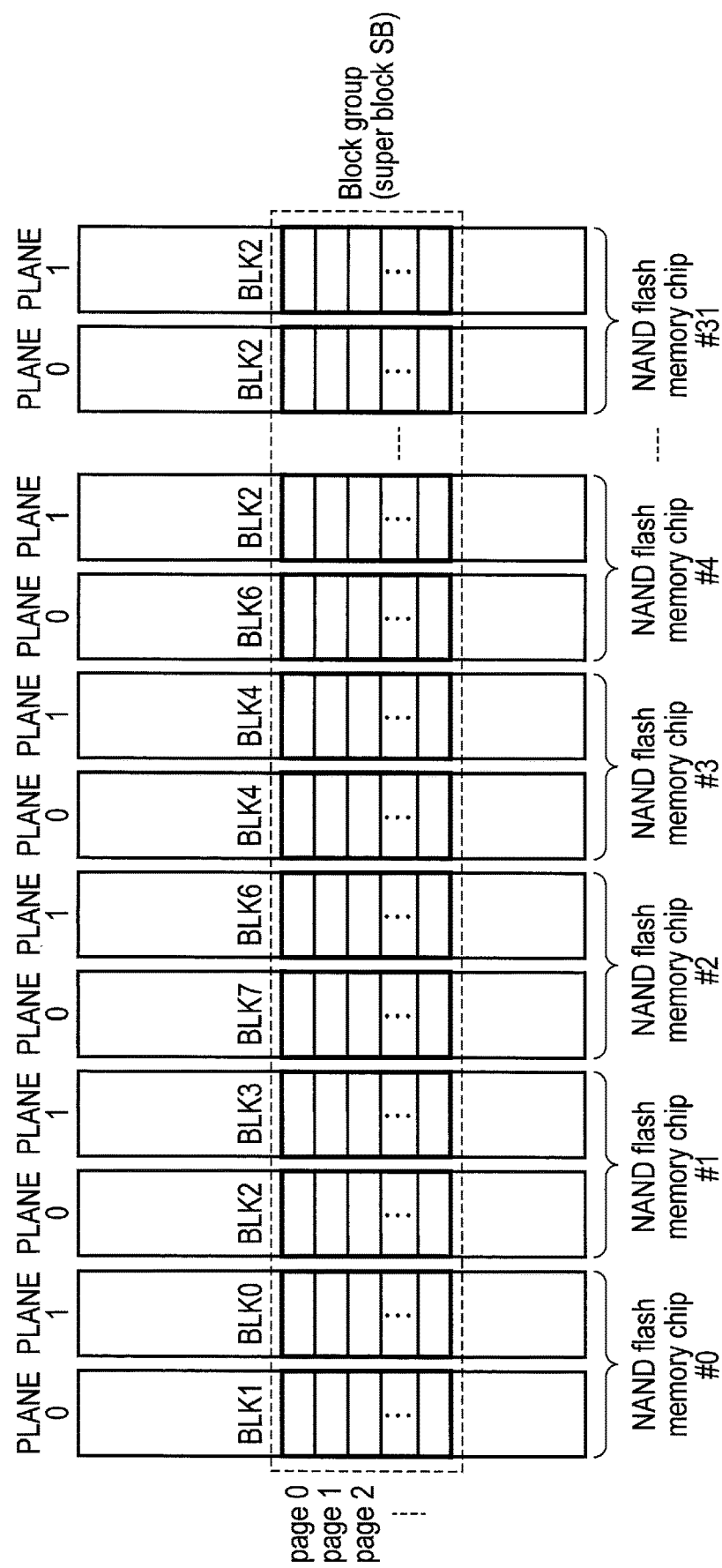
F I G. 6

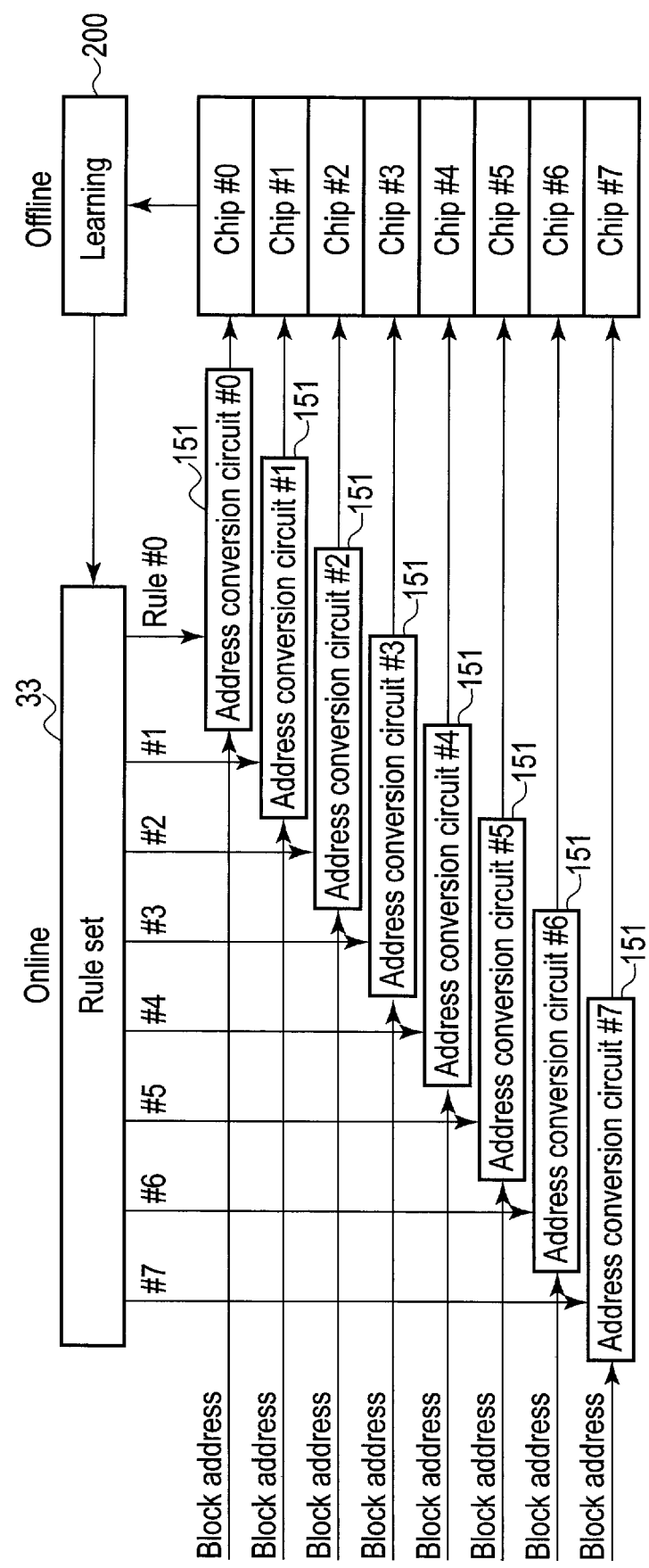
F I G. 10

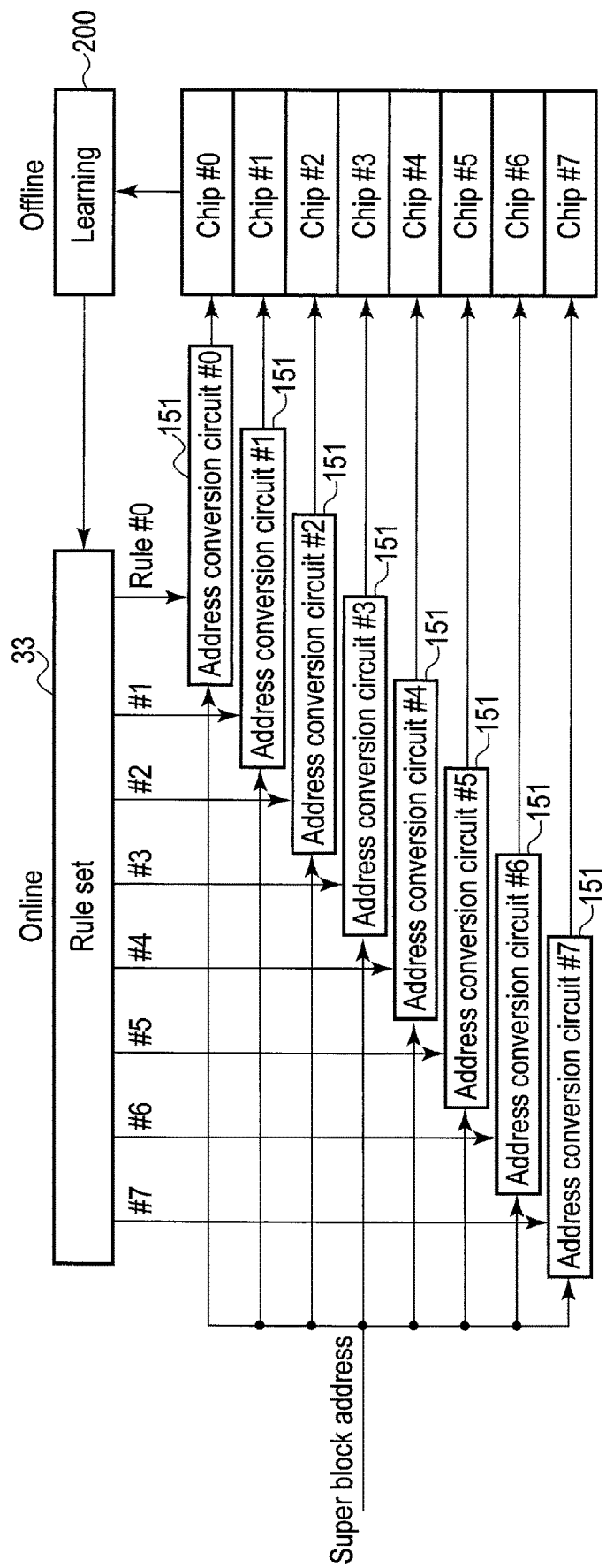
F I G. 12

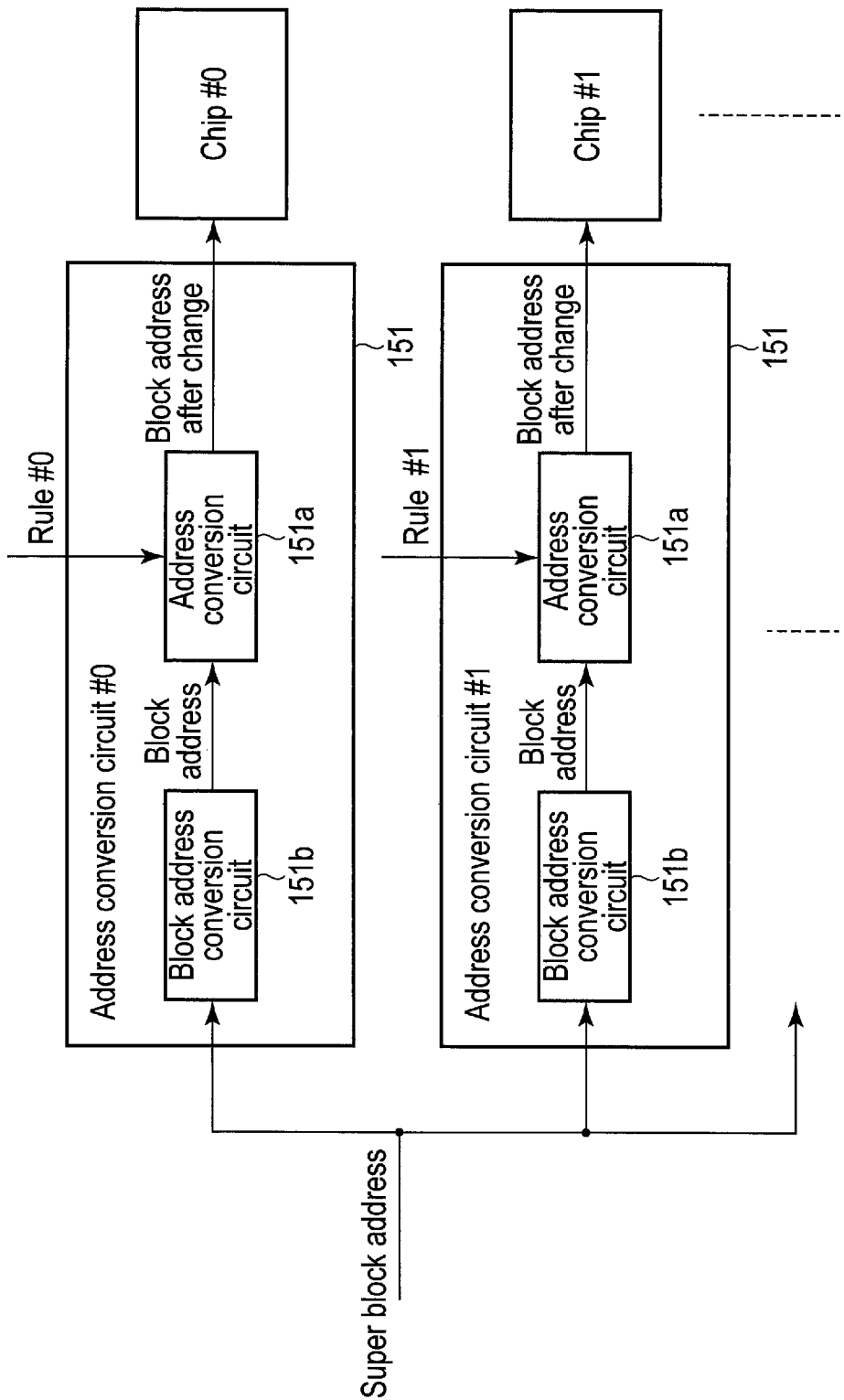
F I G. 13

MEMORY SYSTEM FOR CONTROLLING NONVOLATILE MEMORY

CROSS-REFERENCE TO RELATED APPLICATIONS

This application is based upon and claims the benefit of priority from Japanese Patent Application No. 2018-108591, filed Jun. 6, 2018, the entire contents of which are incorporated herein by reference.

FIELD

Embodiments described herein relate generally to a technique for controlling a nonvolatile memory.

BACKGROUND

In recent years, memory systems including nonvolatile memories have been in widespread use. As one of these memory systems, a solid state drive (SSD) based on NAND flash technology is known.

In memory systems such as SSD, a technique for accessing a plurality of blocks (physical blocks) in parallel may be used to improve read/write performance.

In general, however, individual nonvolatile memory chips installed in the memory system may have defective blocks that are unusable. When constructing a set of blocks to be accessed in parallel, it is necessary to consider the presence of such defective blocks.

BRIEF DESCRIPTION OF THE DRAWINGS

FIG. 1 is a block diagram illustrating a configuration example of an information processing system including a memory system (flash storage device) according to an embodiment.

FIG. 5 is a diagram illustrating a configuration example of a certain parallel access unit used in the memory system of the embodiment.

FIG. 6 is a diagram illustrating another configuration example of a certain parallel access unit used in the memory system of the embodiment.

FIG. 10 is a block diagram illustrating an example of the relationship between a plurality of address conversion circuits and a plurality of NAND flash memory chips, which are included in the memory system of the embodiment.

FIG. 12 is a block diagram illustrating another example of the relationship between a plurality of address conversion circuits and a plurality of NAND flash memory chips, which are included in the memory system of the embodiment.

FIG. 13 is a block diagram illustrating a configuration example of address conversion circuits included in the memory system of the embodiment.

DETAILED DESCRIPTION

Figure 2:
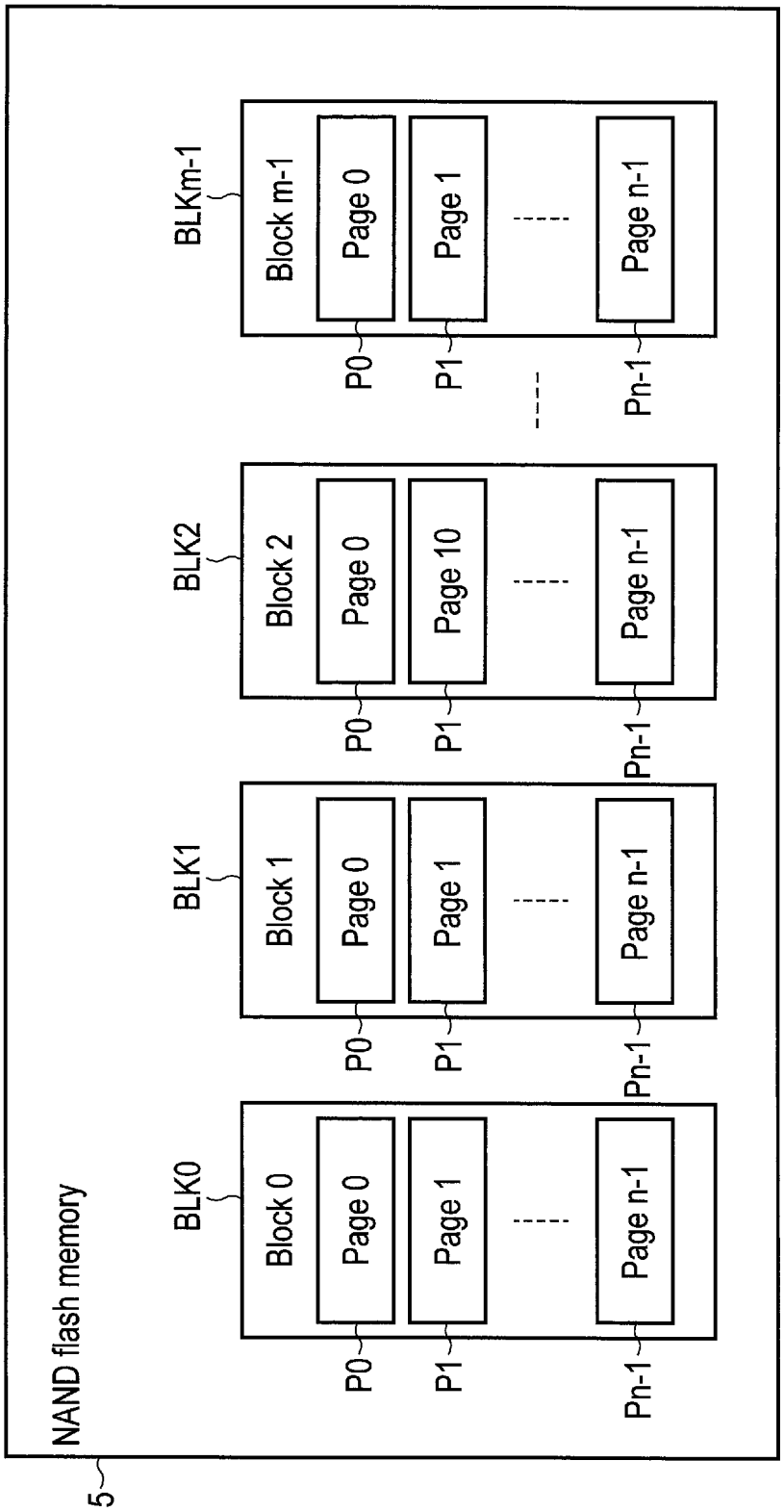
FIG. 2 is a block diagram illustrating a configuration example of a nonvolatile memory included in the memory system of the embodiment.

Various embodiments will be described hereinafter with reference to the accompanying drawings.

In general, according to one embodiment, a memory system includes a plurality of nonvolatile memory chips each of which includes a plurality of blocks, and a controller electrically connected to the nonvolatile memory chips and configured to control a plurality of parallel access units each of which includes a plurality of blocks belonging to different nonvolatile memory chips.

The memory system stores information indicating a plurality of address conversion rules that corresponds to the nonvolatile memory chips, the address conversion rules being prescribed such that the number of defective blocks included in each of the parallel access units is equal to or smaller than a first number. Each of the address conversion rules indicates a mathematical rule for converting a block address to be sent to the nonvolatile memory chip into another block address.

The controller includes an address conversion circuit configured to execute an address conversion operation of converting each of the block addresses to be sent to each of the nonvolatile memory chips into another block address based on the respective mathematical rules in the address conversion rules.

First, a configuration of an information processing system 1 including the memory system according to an embodiment will be described with reference to FIG. 1.

This memory system is a semiconductor storage device that is configured to write data into a nonvolatile memory and read data from the nonvolatile memory. This memory system is implemented as a flash storage device 3 based on NAND flash technology.

The information processing system 1 includes a host (host device) 2 and a flash storage device 3. The host 2 is an information processing device (computing device) that accesses the flash storage device 3. The host 2 may be a server computer or a personal computer.

In a case where the host 2 is implemented as a server computer, the host 2 may be connected to a plurality of end user terminals (clients) 51 via a network 50. The host 2 can offer various services to these end user terminals 51.

Examples of the services that can be offered by the host (server) 2 include: (1) Platform as a Service (PaaS) by which to provide a system-running platform to the clients (the end user terminals 51); (2) Infrastructure as a Service (IaaS) by which to provide an infrastructure such as a virtual server to the clients (the end user terminals 51), and others.

In a physical server acting as the host (server) 2, host software is executed. The host software may include an application software layer 41, an operating system 42, a file system 43, a device driver 44, and others.

A plurality of virtual machines may be executed on the physical server acting as the host (server) 2. Each of the virtual machines running on the host (server) 2 can act as a virtual server configured to offer various services to some corresponding clients (end user terminals 51).

The flash storage device 3 can be used as an external storage of the information processing device acting as the host 2. The flash storage device 3 may be built in the information processing device or may be connected to the information processing device via a cable or a network.

As an interface for interconnecting the host 2 and the flash storage device 3, SCSI, Serial Attached SCSI (SAS), ATA, Serial ATA (SATA), PCI Express (PCIe) (registered trademark), Ethernet (registered trademark), Fibre channel, NVM Express (NVMe) (registered trademark), or the like can be used.

The flash storage device 3 includes a controller 4 and a nonvolatile memory (NAND flash memory) 5. The flash storage device 3 may also include a random access memory, for example, a DRAM 6.

The NAND flash memory 5 includes a memory cell array including a plurality of memory cells arranged in a matrix. The NAND flash memory 5 may be a two-dimensional NAND flash memory or a three-dimensional NAND flash memory.

The memory cell array in the NAND flash memory 5 includes a plurality of blocks BLK0 to BLKm-1 as illustrated in FIG. 2. Each of the blocks BLK0 to BLKm-1 includes a plurality of pages (in this case, pages P0 to Pn-1). Each of the blocks BLK0 to BLKm-1 acts as an erase operation unit. That is, each of the blocks BLK0 to BLKm-1 is a unit for erasing data. The blocks may also be called "physical blocks" or "erase blocks". Each of the pages P0 to Pn-1 includes a plurality of memory cells connected to the same word line. The pages P0 to Pn-1 are the units of data write operation and data read operation. That is, each of the pages P0 to Pn-1 is a unit for reading and writing data.

In the present embodiment, the controller 4 controls a plurality of parallel access units each of which includes a set of blocks (physical blocks). The parallel access units are also called "super blocks" or "logical blocks". Each of the parallel access units is a block group including a plurality of blocks (physical blocks) belonging to different NAND flash memory chips. The controller 4 can execute a data write operation and a data read operation in parallel on a plurality of blocks included in a certain parallel access unit. The controller 4 executes an erase operation in a unit of a parallel access unit. Therefore, each of the parallel access units actually acts as a unit of erase operation.

As illustrated in FIG. 1, the data stored in the NAND flash memory 5 is broadly divided into user data and management data. The user data is data requested to be written from the host 2. The management data includes various kinds of management information for controlling the operations of the controller 4. Examples of the management information can include a lookup table (LUT) 32 that acts as a logical-physical address translation table and a rule set 33 for exchanging block addresses between the blocks in each of the chips such that the numbers of defective blocks included in the parallel access units become almost the same.

The controller 4 is electrically connected to the NAND flash memory 5 as a nonvolatile memory via a NAND interface 13 such as Toggle interface or open NAND flash interface (ONFI). The controller 4 is a memory controller (control circuit) configured to control the NAND flash memory 5.

Figure 3:
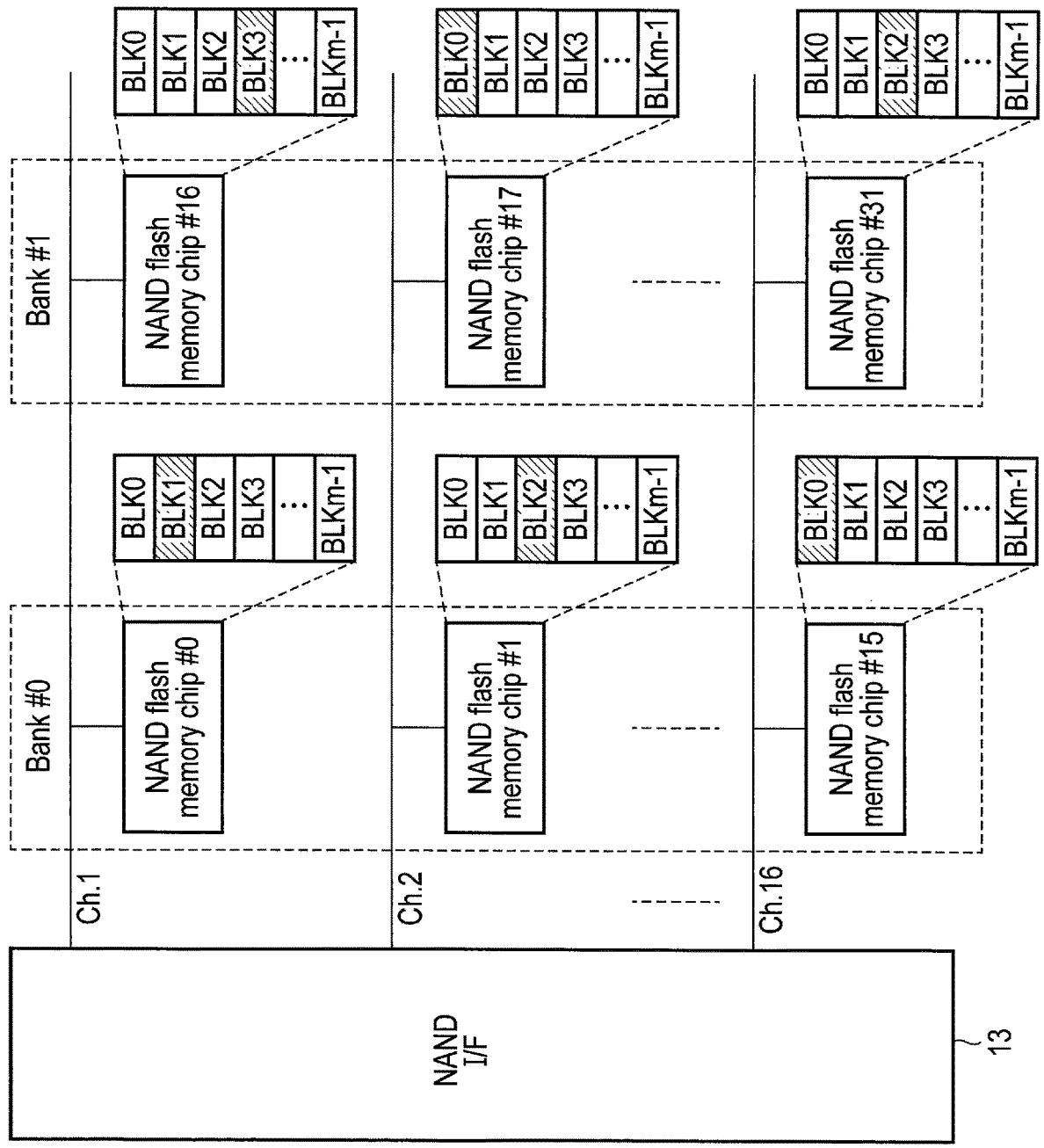
FIG. 3 is a block diagram illustrating the relationship between a plurality of channels and a plurality of NAND flash memory chips, which are used in the memory system of the embodiment.

The NAND flash memory 5 may include a plurality of NAND flash memory chips (NAND flash memory dies) as illustrated in FIG. 3. The individual NAND flash memory chips can operate independently. Accordingly, each of the NAND flash memory chips acts as unit allowing parallel operation. FIG. 3 illustrates a case in which 16 channels Ch. 1 to Ch. 16 are connected to the NAND interface 13 and two NAND flash memory chips are connected to each of the 16 channels Ch. 1 to Ch. 16. In this case, 16 NAND flash memory chips #0 to #15 connected to the channels Ch. 1 to Ch. 16 may be set up as a bank #0 and the remaining 16 NAND flash memory chips #16 to #31 connected to the channels Ch. 1 to Ch. 16 may be set up as a bank #1. Each of the banks acts as a unit for operating a plurality of memory modules in parallel by bank interleave. In the configuration example of FIG. 3, up to 32 NAND flash memory chips can be operated in parallel by the 16 channels and the bank interleave using the two banks.

In the present embodiment, the controller 4 controls the parallel access units (hereinafter, called super blocks) each of which is formed from a plurality of blocks BLK as described above.

One super block is not limited to this but may include total 32 blocks BLK, which are selected one by one from the NAND flash memory chips #0 to #31. Referring to FIG. 3, each of the blocks (physical blocks) indicated by hatching represents the block included in one super block.

Figure 4:
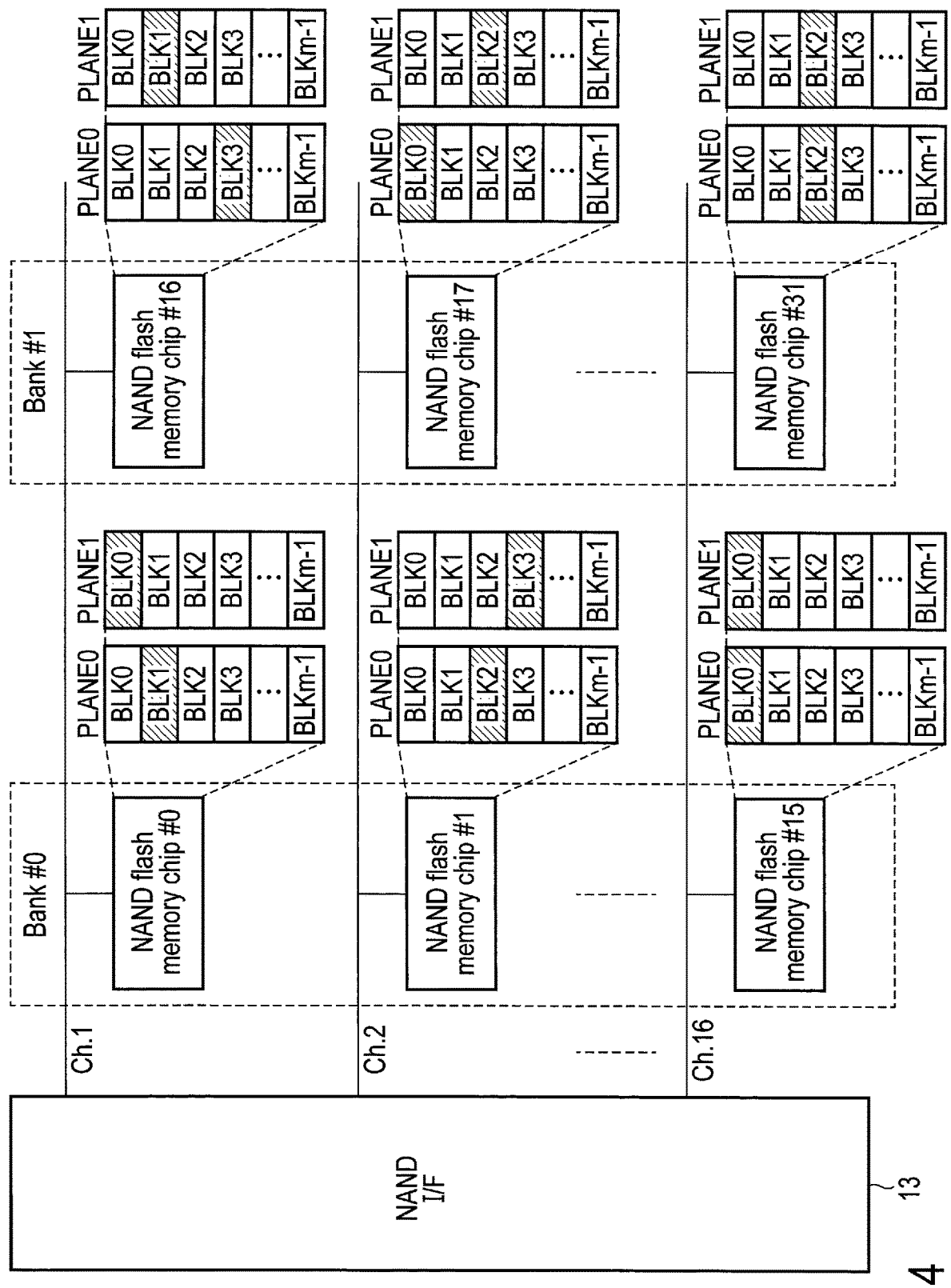
FIG. 4 is a block diagram illustrating the relationship between a plurality of channels and a plurality of NAND flash memory chips each of which includes a plurality of planes, which are used in the memory system of the embodiment.

Each of the NAND flash memory chips #0 to #31 may have a multi-plane structure. Each of the planes includes a plurality of blocks (physical blocks). For example, when each of the NAND flash memory chips #0 to #31 has a multi-plane structure including two planes (PLANE0 and PLANE1) as illustrated in FIG. 4, one super block may include total 64 blocks BLK, which are selected one by one from the 64 planes corresponding to the NAND flash memory chips #0 to #31. Referring to FIG. 4, each of the blocks (physical blocks) indicated by hatching represents the block included in one super block.

FIG. 5 illustrates an example of one super block (SB) including 32 blocks (in this case, the block BLK1 in the NAND flash memory chip #0, the block BLK2 in the NAND flash memory chip #1, the block BLK7 in the NAND flash memory chip #2, the block BLK4 in the NAND flash memory chip #3, the block BLK6 in the NAND flash memory chip #4, . . . , the block BLK2 in the NAND flash memory chip #31).

At writing of data into this super block (SB), the controller 4 may write data in the order of the page 0 in the block BLK1 in the NAND flash memory chip #0, the page 0 in the block BLK2 in the NAND flash memory chip #1, the page 0 in the block BLK7 in the NAND flash memory chip #2, the page 0 in the block BLK4 in the NAND flash memory chip #3, the page 0 in the block BLK6 in the NAND flash memory chip #4, . . . , the page 0 in the block BLK2 in the NAND flash memory chip #31, the page 1 in the block BLK1 in the NAND flash memory chip #0, the page 1 in the block BLK2 in the NAND flash memory chip #1, . . . . This allows writing of data into up to 32 pages in parallel. In addition, at reading of data from this super block (SB), data from up to 32 pages can be read in parallel.

FIG. 6 illustrates an example of one super block (SB) including 64 blocks (in this case, the block BLK1 in the plane 0 in the NAND flash memory chip #0, the block BLK0 in the plane 1 in the NAND flash memory chip #0, the block BLK2 in the plane 0 in the NAND flash memory chip #1, the block BLK3 in the plane 1 in the NAND flash memory chip #1, the block BLK7 in the plane 0 in the NAND flash memory chip #2, the block BLK6 in the plane 1 in the NAND flash memory chip #2, the block BLK4 in the plane 0 in the NAND flash memory chip #3, the block BLK4 in the plane 1 in the NAND flash memory chip #3, the block BLK6 in the plane 0 in the NAND flash memory chip #4, the block BLK2 in the plane 1 in the NAND flash memory chip #4, . . . , the block BLK2 in the plane 0 in the NAND flash memory chip #31, and the block BLK2 in the plane 1 in the NAND flash memory chip #31).

Next, a configuration of the controller 4 illustrated in FIG. 1 will be described.

The controller 4 is electrically connected to a plurality of NAND flash memory chips via a plurality of channels (for example, 16 channels). The controller 4 controls a plurality of super blocks each of which includes a plurality of blocks (physical blocks) belonging to different NAND flash memory chips (or different planes).

The controller 4 may act as a flash translation layer (FTL) that is configured to execute data management and block management in the NAND flash memory 5. The data management executed by the FTL includes (1) management of mapping information indicating correspondences between logical addresses and physical addresses of the NAND flash memory 5, (2) processing for concealing restrictions of the NAND flash memory 5 (for example, read/write operations executed in unit of a page units, and erase operation executed in unit of a block (super block), and others). Each of the logical addresses is an address used by the host 2 to specify a position in a logical address space of the flash storage device 3. The logical addresses can be logical block addresses (addressing) (LBAs).

The mapping between the logical addresses and the physical addresses is managed using the lookup table (LUT) 32 that acts as a logical-physical address translation table. The controller 4 uses the lookup table (LUT) 32 to manage the mapping between the logical addresses and the physical addresses by a predetermined management size. The physical address corresponding to a logical address indicates the latest physical storage location in the NAND flash memory 5 where the data corresponding to the logical address is written. The address translation table (LUT 32) may be loaded from the NAND flash memory 5 into the DRAM 6 at the time of power-on of the flash storage device 3.

In the NAND flash memory 5, writing of data into a page is allowed only one time in each erase cycle. That is, new data cannot be written directly in the region of the block in which data is already written. Accordingly, to update the already written data, the controller 4 writes new data into a non-written region in the block or in another block, and treats the previous data as invalid data. In other words, the controller 4 writes the updating data corresponding to one logical address not into the physical storage location where the previous data is stored corresponding to this logical address, but into another physical storage location. Then, the controller 4 updates the LUT 32 and associates the logical address with the other physical storage location and invalidates the previous data.

The block management includes management of defective blocks (bad blocks), wear leveling, garbage collection (GC), and others. The defective block means a physical block where data cannot be read or written correctly. The wear leveling is an operation of leveling the wear of blocks. In the GC, valid data in several blocks (GC source super blocks) in which the valid data and invalid data are mixed is copied to a free block (GC destination super block). The controller 4 updates the lookup table (LUT) 32 and maps copy destination physical addresses to the logical addresses of the copied valid data. A block (super block) which contains only invalid data after valid data have been copied to another block (GC destination super block) is released as a free block (free super block). Accordingly, this super block becomes reusable after an erase operation is executed on each of blocks belonging to this super block.

In this case, the valid data means the latest data associated with certain logical addresses. For example, the data referred to by the LUT 32 (that is, the data associated as the latest data with the logical addresses) is valid data. The valid data may be read by the host 2 later. The invalid data means data which is not associated with any logical addresses. The data which is not associated with any logical addresses is data which will not be read any more by the host 2.

As illustrated in FIG. 1, the controller 4 includes a host interface 11, a CPU 12, an NAND interface 13, a DRAM interface 14, and hardware logic 15, and others. These host interface 11, CPU 12, NAND interface 13, DRAM interface 14, and hardware logic 15 are connected with one another via a bus 10.

The host interface 11 is a host interface circuit that is configured to execute communications with the host 2. The host interface 11 receives various requests (commands) from the host 2. These requests (commands) include write request (write command), read request (read command), unmap/trim request (unmap/trim command), and other various requests (commands).

The CPU 12 is a processor configured to control the host interface 11, the NAND interface 13, the DRAM interface 14, and the hardware logic 15. In response to the power-on of the flash storage device 3, the CPU 12 loads a control program (firmware) from the NAND flash memory 5 or a ROM not illustrated into the DRAM 6 and executes the firmware to implement various processes. The firmware may be loaded into an SRAM not illustrated in the controller 4. The CPU 12 can execute command processes for processing various commands from the host 2. The operations of the CPU 12 are controlled by the foregoing firmware executed by the CPU 12. Some or all of the command processes may be executed by dedicated hardware in the controller 4.

The CPU 12 can act as a write control unit 21 and a read control unit 22. Some or all portions of each of the write control unit 21 and the read control unit 22 may also be implemented by dedicated hardware in the controller 4.

The states of the blocks (super blocks) are broadly divided into active blocks storing valid data and free blocks not storing valid data. The super blocks as active blocks are managed by a list called active block pool. On the other hand, the super blocks as free blocks are managed by a list called free block pool.

The write control unit 21 allocates one free block (free super block) selected from the free block pool as write destination super block into which data received from the host 2 is to be written. The write control unit 21 executes a process for writing write data received from the host 2 in parallel into a plurality of blocks included in the write destination super block. When the entire write destination super block is filled with data, the write destination super block is managed by the active block pool. In addition, a new write destination super block is allocated from the free block pool.

The read control unit 22 reads data corresponding to the logical address specified by the read command received from the host 2, from the physical storage location in a super block storing this data.

The NAND interface 13 is a memory control circuit configured to control the NAND flash memory 5 under control of the CPU 12. The DRAM interface 14 is a DRAM control circuit configured to control the DRAM 6 under control of the CPU 12. A portion of the storage region in the DRAM 6 may be used as a write buffer (WB) 31 for temporarily storing write data. Another portion of the storage region in the DRAM 6 may be used to store the LUT 32 and the rule set 33 loaded from the NAND flash memory 5.

The rule set 33 includes a plurality of address conversion rules (rule #1, rule #2, . . . , rule # n) prescribed such that the number of defective blocks included in each of the super blocks is equal to or smaller than a threshold. These address conversion rules (rule #1, rule #2, . . . , rule # n) correspond to the NAND flash memory chips included in the flash storage device 3. Alternatively, in a case where each of the NAND flash memory chips has a multi-plane structure, the rule set 33 may include a number of address conversion rules (rule #1, rule #2, . . . , rule # n) that is equal to the total number of planes. In this case, these address conversion rules (rule #1, rule #2, . . . , rule # n) correspond to a plurality of planes. That is, the rule set 33 is information indicating a plurality of address conversion rules that corresponds to the plurality of NAND flash memory chips (or the plurality of planes).

For example, before factory shipment of the flash storage device 3, address conversion rules are determined for individual chips (or individual planes) based on a pattern of defective blocks in each of the NAND flash memory chips mounted in the flash storage device 3 such that the number of defective blocks is unified among the super blocks. Then, the rule set 33 including these determined address conversion rules is permanently stored in the flash storage device 3. For example, the rule set 33 may be permanently stored in at least one of the NAND flash memory chips. Alternatively, when the flash storage device 3 further includes a nonvolatile memory (for example, an NOR flash memory chip) other than the NAND flash memory chips, the rule set 33 may be permanently stored in this nonvolatile memory other than the NAND flash memory chips.

One address conversion rule indicates a mathematical rule for converting a block address to be sent to one nonvolatile memory chip (or one plane) corresponding to this address conversion rule, into another block address of this chip (or this plane). The block address is an address for uniquely identifying a specific block (physical block) in an NAND flash memory chip (or a plane). The block address may also be called a block number. Examples of a usable mathematical rule include the addition of any integer to a block address to be sent to each NAND flash memory chip (or each plane), the subtraction of any integer from a block address, the subtraction of the block address from the maximum block address corresponding to each NAND flash memory chip (or each plane), or the inversion of some or all of a plurality of bits indicating a block address, and others. Each of the address conversion rules may indicate any one or a combination of any two or more of the addition, subtractions, and inversion.

The hardware logic 15 includes an address conversion circuit 151. The address conversion circuit 151 is an arithmetic circuit that is configured to execute an address conversion operation of converting each of block address to be sent to each NAND flash memory chip (or each plane) into another block address of each NAND flash memory chip (or each plane) based on each of the mathematical rules of the address conversion rules (rule #1, rule #2, . . . , rule # n) included in the rule set 33. The address conversion circuit 151 may execute a plurality of address conversion operations corresponding to the plurality of NAND flash memory chips (or the plurality of planes) in a time-division manner. Alternatively, the address conversion circuit 151 may include a plurality of address conversion circuits corresponding to the plurality of NAND flash memory chips (or the plurality of planes). In this case, the address conversion circuit 151 can execute a plurality of address conversion operations corresponding to the plurality of NAND flash memory chips (or the plurality of planes) at the same time.

Figure 7:
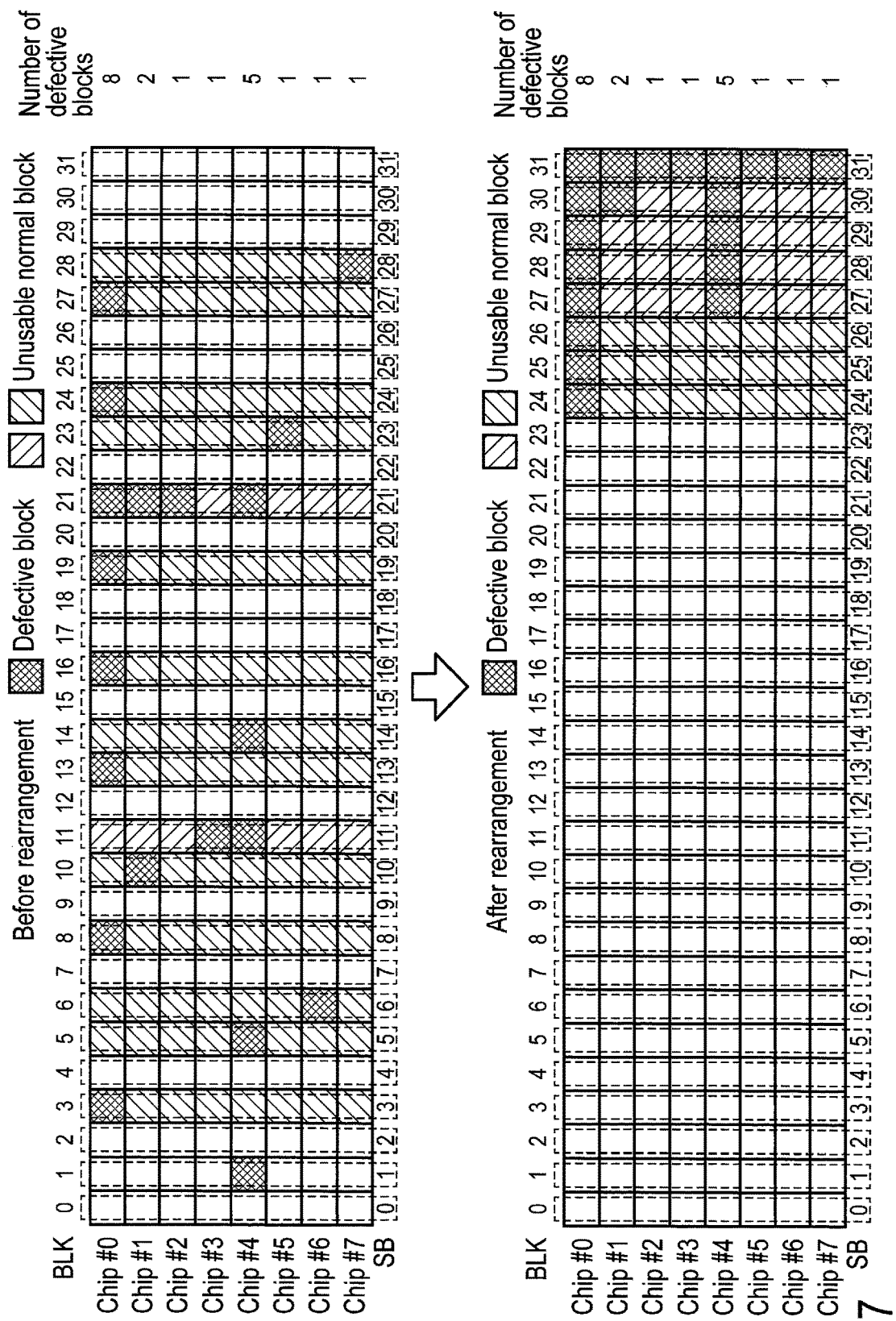
FIG. 7 is a diagram illustrating an example of a pattern of defective blocks existing in the NAND flash memory chips.

The upper part of FIG. 7 illustrates an example of a pattern of defective blocks existing in the plurality of NAND flash memory chips.

This case is based on the assumption that the flash storage device 3 includes eight NAND flash memory chips (chip #0 to chip #7), each of the eight NAND flash memory chips (chip #0 to chip #7) includes 32 blocks (BLK0 to BLK31), and the eight blocks belonging to the chip #0 to chip #7 is set up as one super block SB. The block addresses of the blocks belonging to one super block SB can be determined based on a mathematical rule from the address for identifying this super block SB (super block address).

Using the method by which to determine a unique combination of block addresses based on the mathematical rule from the super block address makes it easy to specify a combination of block addresses belonging to each super block only from each super block address without having to use a management table dedicated for each super block holding the block addresses belonging to each super block.

The mathematical rule can be an arbitrary regulation on which a unique combination of block addresses can be determined from a super block address.

In this case, for the sake of simplified illustration, one super block SB includes a set of blocks with the same block address as the super block address of the super block SB.

Specifically, the super block SB0 includes eight blocks BLK0 belonging to the chip #0 to the chip #7, the super block SB1 includes eight blocks BLK1 belonging to the chip #0 to the chip #7, the super block SB2 includes eight blocks BLK2 belonging to the chip #0 to the chip #7, and similarly the super block SB31 includes eight blocks BLK31 belonging to the chip #0 to the chip #7.

The upper part of FIG. 7 illustrates defective blocks indicated by cross-hatching. The chip #0 includes eight defective blocks, the chip #1 includes two defective blocks, the chip #2 includes one defective block, the chip #3 includes one defective block, the chip #4 includes five defective blocks, the chip #5 includes one defective block, the chip #6 includes one defective block, and the chip #7 includes one defective block.

Under a policy that no super block including one or more defective blocks will be used, normal blocks belonging to super blocks including one or more defective blocks (indicated by single hatching) would become unusable. Referring to FIG. 7, the blocks hatched by solid lines extending from the upper right to lower left are normal blocks belonging to the super blocks including one defective block (unusable normal blocks), and the blocks hatched by solid lines from the upper left to lower right are normal blocks belonging to the super blocks including two or more defective blocks (unusable normal blocks).

The lower part of FIG. 7 illustrates a process for replacing the defective blocks included in the chips with blocks other than the defective blocks belonging to the same chips.

For example, in the chip #0, the defective block BLK3, the defective block BLK8, the defective block BLK13, the defective block BLK16, the defective block BLK19, and the defective block BLK21 may be replaced with the block BLK25, the block BLK26, the block BLK28, the block BLK29, the block BLK30, and the block BLK31 belonging to the chip #0. Similarly, in the chip #1, the defective block BLK10 and the defective block BLK21 may be replaced with the block BLK30 and the block BLK31 belonging to the chip #1.

In this manner, by replacing the defective blocks included in the chips with blocks other than the defective blocks belonging to the same chips, the total (=32−8) blocks from the beginning of each of the chips become usable. However, the remaining blocks BLK24 to BLK31 in each of the chips are unusable. Accordingly, the number of the constructible super blocks SB is limited to the number of the normal blocks in the chip #0 with the largest number of defective blocks.

In the present embodiment, the address conversion rules are predetermined for the individual chips such that the number of the defective blocks included in each of the super blocks SB0 to SB31 is equal to or smaller than a threshold. Based on the determined address conversion rules, the controller 4 executes an address conversion operation of converting each of the block addresses to be sent to each of the chips into another block address.

Figure 8:
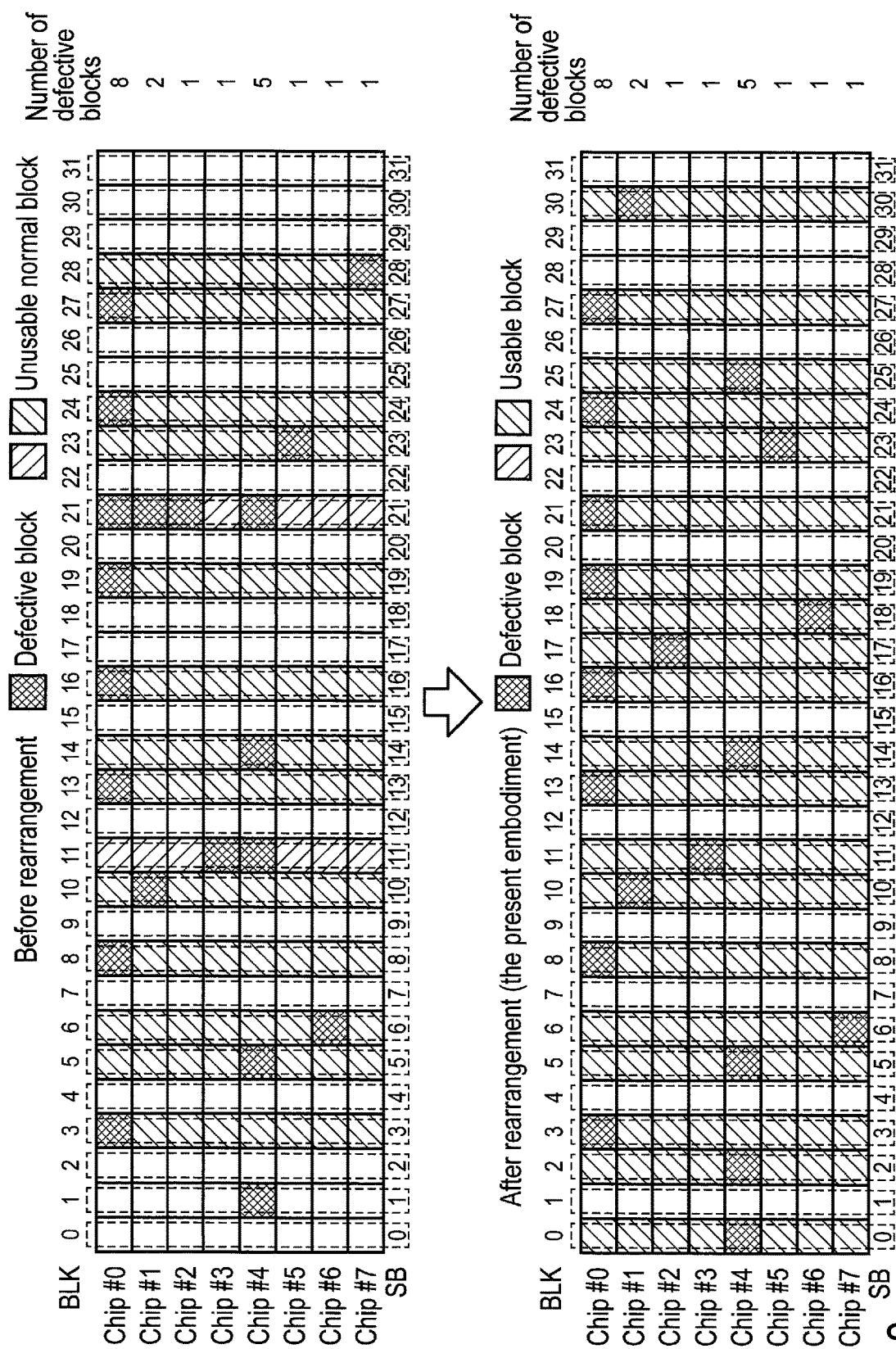
FIG. 8 is a diagram illustrating a block rearrangement operation executed by the memory system of the embodiment.

The upper part of FIG. 8 illustrates an example of a pattern of defective blocks existing in the plurality of NAND flash memory chips. This pattern of defective blocks is the same as the pattern of defective blocks illustrated in the upper part of FIG. 7.

The lower part of FIG. 8 illustrates a block rearrangement operation executed by the controller 4.

As illustrated in the lower part of FIG. 8, in the present embodiment, the blocks are rearranged in each of the chips such that the number of defective blocks included in each of the super blocks SB0 to SB31 is equal to or smaller than a threshold. In this case, the blocks are rearranged in each of the chips such that the number of defective blocks included in each of the super blocks SB0 to SB31 is 1 or less as an example. However, the upper limit of the number of permissible defective block included in each of the super blocks is not limited to 1 but can be set to an integer equal to or smaller than the average of the numbers of defective blocks included in each of the chips, for example. In this case, since the total number of the defective blocks is 20 and the number of the chips is eight, the upper limit of the number of permissible defective blocks can be an integer equal to or smaller than the average number of defective blocks (=2.5). This makes the number of usable blocks larger than that in the block rearrangement illustrated in the lower part of FIG. 7, while limiting the differences in the number of defective blocks among the super blocks SB0 to SB31 within a certain range.

The number of defective blocks per chip varies depending on chips. The difference in the number of defective blocks among chips tends to increase with a larger number of steps for manufacturing these chips. The manufacture of the modern flash memory chip including many layers, like a three-dimensional flash memory, needs a large number of manufacturing steps. Accordingly, the differences in the number of defective blocks among chips are relatively large. In addition, most of chips generally include a small number of defective blocks, but some of chips include a large number of defective blocks.

In the block rearrangement illustrated in the lower part of FIG. 7, the number of usable blocks in each of the chips is limited to the number (24 in this case) of normal blocks in the chip #0 with the largest number of defective blocks.

On the other hand, in the block rearrangement illustrated in the lower part of FIG. 8, the number of usable blocks in each of the chips is not influenced by the number of the normal blocks in the chip #0 with the largest number of defective blocks. Therefore, unless the total number of the defective blocks in all the chips is extremely large, the differences in the number of defective blocks among the super blocks SB0 to SB31 can be limited within a certain range. Accordingly, the differences in read/write performance among the super blocks SB0 to SB31 can fall within a permissible range.

If the relationship between super blocks and aggregates of blocks belonging to the super blocks is managed by using a table of management information, many memory resources will be consumed to store the management information. For example, the size of the management information is equal to [the total number of blocks in all the chips]×[chip addresses+block addresses]. In general, one chip includes about 1000 to 2000 blocks. The amount of information necessary for expressing [chip addresses+block addresses] is about two bytes. Accordingly, the size of the management information is very large.

In the present embodiment, the block addresses are exchanged between the blocks in each of the chips by the address conversion operations based on the address conversion rules indicating the mathematical rules (arithmetic and logical operations such as addition, subtraction, and bit inversion), thereby executing block rearrangement. One address conversion rule can specify only one of several usable operations and parameters for use in this operation, for example. Accordingly, the amount of data necessary for storage of one address conversion rule is several bits. Therefore, in the present embodiment, the size of the rule set 33 is equal to [the total number of chips (or the total number of planes)]×[several bits], which allows control of a plurality of super blocks at low cost.

Figure 9:
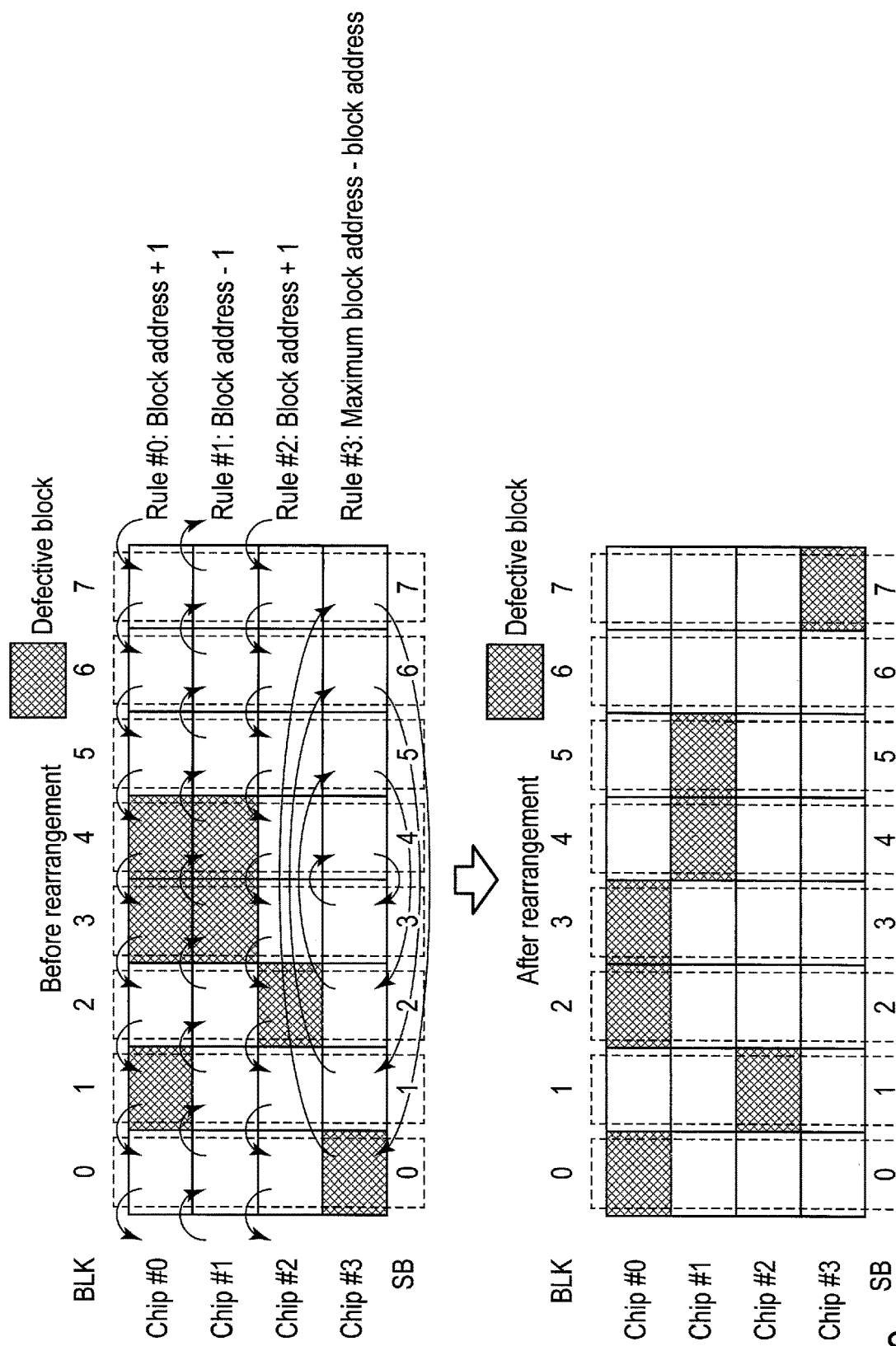
FIG. 9 is a diagram illustrating examples of address conversion operations executed by the memory system of the embodiment.

FIG. 9 illustrates examples of address conversion operations executed by the address conversion circuit 151 of the controller 4.

The upper part of FIG. 9 illustrates an example of a pattern of defective blocks existing in a plurality of NAND flash memory chips and examples of respective address conversion rules applied to the chips.

For the sake of simplified illustration, the upper part of FIG. 9 is based on the assumption that the flash storage device 3 includes four NAND flash memory chips (chip #0 to chip #3), each of the four NAND flash memory chips (chips #0 to chip #3) includes eight blocks (block BLK0 to block BLK7), and the four blocks belonging to the chip #0 to the chip #3 are set up as one super block SB. The blocks indicated by cross-hatching are defective blocks.

The block addresses of the blocks belonging to one super block SB can be determined based on mathematical rules from the address of this super block SB (super block address). In this case, for the sake of simplified illustration, it is assumed that one super block SB includes a set of blocks with the same block address as the super block address of the super block SB.

In the chip #0, for example, the addition of 1 to a block address to be sent to the chip #0 may be applied as address conversion rule #0.

When the block address of three bits (block number) to be sent to the chip #0 indicates 0 (="000"), the block address of three bits (block number) is converted into 1 (="001"), and the block BLK1 with the block address (="001") is accessed instead of the block BLK0 with the block address (="000").

When the block address of three bits (block number) to be sent to the chip #0 indicates 1 (="001"), the block address of three bits (block number) is converted into 2 (="010"), and the block BLK2 with the block address (="010") is accessed instead of the block BLK1 with the block address (="001").

Similarly, when the block address of three bits (block number) to be sent to the chip #0 indicates 7 (="111"), the block address of three bits (block number) is converted into 0 (="000"), and the block BLK0 with the block address (="000") is accessed instead of the block BLK7 with the block address (="111").

In this manner, the same address conversion operation (in this case, the addition of 1 to a block address) is performed on each of the block addresses to be sent to the chip #0 so that the blocks in the chip #0 are shifted by one block to the left as illustrated in the lower part of FIG. 9. As a result, in the chip #0, the defective block BLK1 is treated as a block belonging to the super block SB0, not as a block belonging to the super block SB1. Similarly, the defective block BLK3 is treated as a block belonging to the super block SB2, not as a block belonging to the super block SB3, and the defective block BLK4 is treated as a block belonging to the super block SB3, not as a block belonging to the super block SB4.

In the chip #1, for example, the subtraction of 1 from a block address to be sent to the chip #1 may be applied as address conversion rule #1.

In this case, the same address conversion operation (in this case, the subtraction of 1 from a block address) is performed on each of the block addresses to be sent to the chip #1 so that the blocks in the chip #1 are shifted by one block to the right as illustrated in the lower part of FIG. 9. As a result, in the chip #1, the defective block BLK4 is treated as a block belonging to the super block SB5, not as a block belonging to the super block SB4. Similarly, the defective block BLK3 is treated as a block belonging to the super block SB4, not as a block belonging to the super block SB3.

In the chip #2, for example, the addition of 1 to a block address to be sent to the chip #2 may be applied as address conversion rule #2.

In this case, the same address conversion operation (in this case, the addition of 1 to a block address) is performed on each of the block addresses to be sent to the chip #2 so that the blocks in the chip #2 are shifted by one block to the left as illustrated in the lower part of FIG. 9. As a result, in the chip #2, the defective block BLK2 is treated as a block belonging to the super block SB1, not as a block belonging to the super block SB2.

In the chip #3, for example, the subtraction of a block address to be sent to the chip #3 from the maximum block address (="111") may be applied as address conversion rule #3.

When the block address of three bits (block number) to be sent to the chip #3 indicates 0 (="000"), the block address of three bits (block number) is converted into 7 (="111"), and the block BLK7 with the block address (="111") is accessed instead of the block BLK0 with the block address (="000"). When the block address of three bits (block number) to be sent to the chip #3 indicates 1 (="001"), the block address of three bits (block number) is converted into 6 (="110"), and the block BLK6 with the block address (="110") is accessed instead of the block BLK1 with the block address (="001").

Similarly, when the block address of three bits (block number) to be sent to the chip #3 indicates 7 (="111"), the block address of three bits (block number) is converted into 0 (="000"), and the block BLK0 with the block address (="000") is accessed instead of the block BLK7 with the block address (="111").

In this manner, the same address conversion operation (in this case, the subtraction of a block address from the largest block address) is performed on each of the block addresses to be sent to the chip #3 so that the positions of the defective block BLK0 and the normal block BLK7 in the chip #3 are exchanged, for example, as illustrated in the lower part of FIG. 9.

Examples of mathematical rules usable for address conversion also include the following operations:

(1) Inverting only the least significant bit [b0] of a block address: this operation may be performed when the total number of blocks per chip (or plane) is an integral multiple of 2.

(2) Exchanging four combinations expressed by the two lower bits [b1, b0] of a block address: this operation may be performed when the total number of blocks per chip (or plane) is an integral multiple of 4. For example, the positions of the two lower bits [b1, b0] may be exchanged such that the two lower bits [b1, b0] are converted into [b0, b1] or the two lower bits [b1, b0] may be inverted.

(3) Exchanging eight combinations expressed by the three lower bits [b2, b1, b0] of a block address: this operation may be performed when the total number of blocks per chip (or plane) is an integer multiple of 8.

(4) Inverting all the bits in the block address

FIG. 10 illustrates an example of the relationship between a plurality of address conversion circuits 151 and a plurality of NAND flash memory chips included in the controller 4 of the flash storage device 3.

This case is based on the assumption that the flash storage device 3 includes eight NAND flash memory chips (chip #0 to chip #7), and the eight blocks belonging to the chip #0 to the chip #7 are set up as one super block SB.

For example, in the initial manufacturing process of the flash storage device 3, a learning process 200 is executed to, based on the patterns of defective blocks existing in the chip #0 to the chip #7 to be mounted on the flash storage device 3, determine respective address conversion rules for the chips such that the numbers of defective blocks are unified among the super blocks. The learning process 200 is executed by a system in the factory, not by the controller 4. This system determines eight address conversion rules corresponding to the chip #0 to the chip #7.

In the learning process 200, the address conversion rules to be applied to the individual chips may be selected from a plurality of kinds of pre-defined usable address conversion rules. The eight determined address conversion rules are permanently stored as rule set 33 in any one of the eight NAND flash memory chips or are permanently stored in another nonvolatile memory in the controller 4.

After the factory shipment of the flash storage device 3, the address conversion circuit #0 corresponding to the chip #0 executes an address conversion operation of converting each of the block addresses to be sent to the chip #0 into another block address based on the mathematical rule indicated by the address conversion rule #0 corresponding to the chip #0. The address conversion circuit #1 corresponding to the chip #1 executes an address conversion operation of converting each of the block addresses to be sent to the chip #1 into another block address based on the mathematical rule indicated by the address conversion rule #1 corresponding to the chip #1. Similarly, the address conversion circuit #7 corresponding to the chip #7 executes an address conversion operation (arithmetic and logic operation) of converting each of the block addresses to be sent to the chip #7 into another block address based on the mathematical rule indicated by the address conversion rule #7 corresponding to the chip #7.

Figure 11:
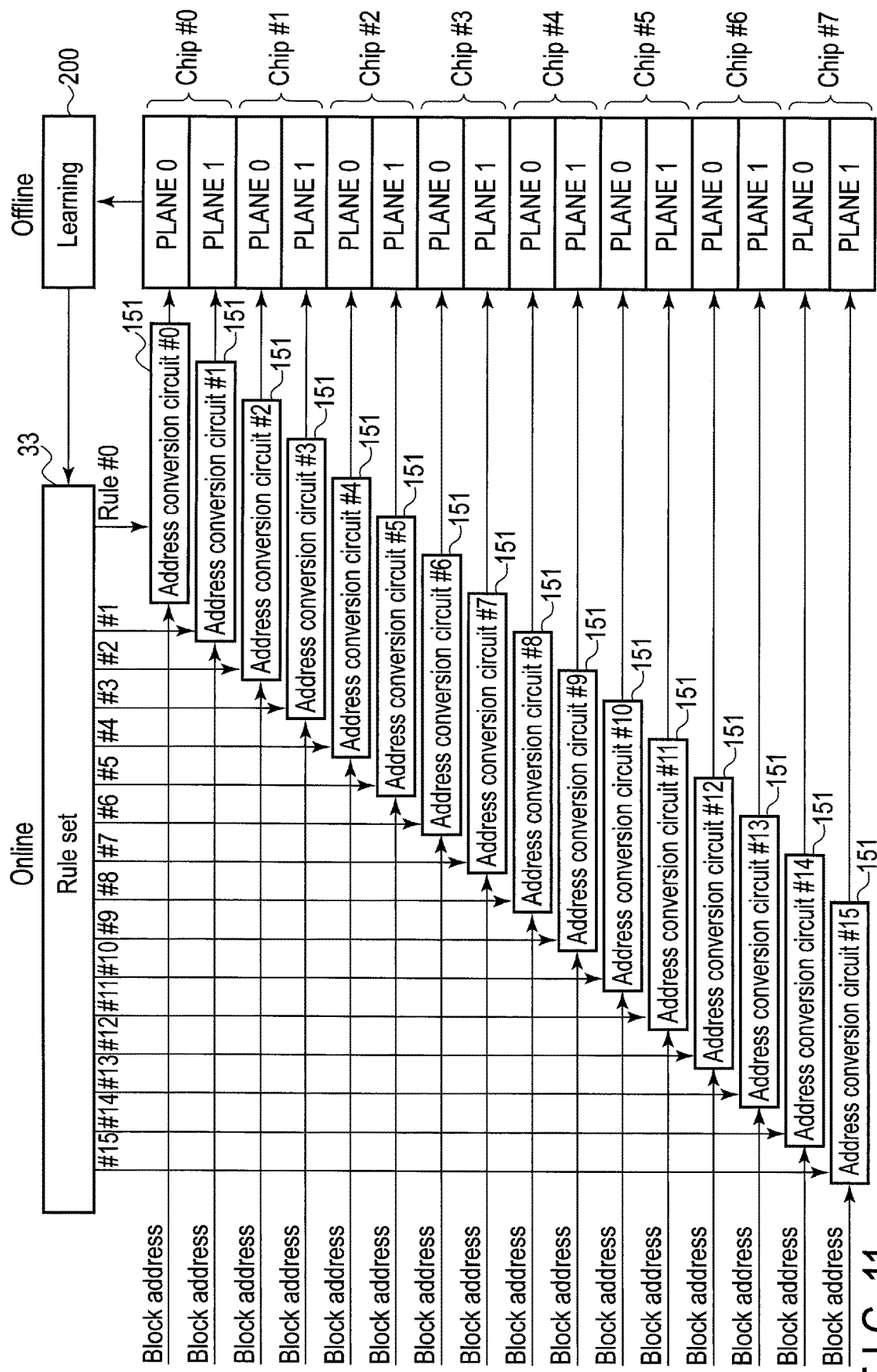
FIG. 11 is a block diagram illustrating an example of the relationship between a plurality of address conversion circuits and a plurality of planes, which are included in the memory system of the embodiment.

FIG. 11 illustrates an example of the relationship between a plurality of address conversion circuits 151 and a plurality of planes included in the controller 4 of the flash storage device 3.

This case is based on the assumption that the flash storage device 3 includes eight NAND flash memory chips (chip #0 to chip #7), each of the chip #0 to the chip #7 includes two planes (PLANE0, PLANE1), and the 16 blocks belonging to the total 16 planes are set up as one super block SB.

For example, in the initial manufacturing process of the flash storage device 3, a learning process 200 is executed to, based on the patterns of defective blocks existing in each of the total 16 planes to be mounted on the flash storage device 3, determine respective address conversion rules for the planes such that the numbers of defective blocks are unified among the super blocks. The learning process 200 is executed by a system in the factory, not by the controller 4. In the learning process 200, the address conversion rule to be applied to each of the planes may be selected from a plurality of kinds of pre-defined usable address conversion rules. This system determines 16 address conversion rules corresponding to the total 16 planes. The 16 address conversion rules are permanently stored as rule set 33 in any one of the eight NAND flash memory chips or are permanently stored in another nonvolatile memory in the controller 4.

After the factory shipment of the flash storage device 3, the address conversion circuit #0 corresponding to the PLANE0 of the chip #0 executes an address conversion operation of converting each of the block addresses to be sent to the PLANE0 of the chip #0 into another block address based on the mathematical rule indicated by the address conversion rule #0 corresponding to the PLANE0 of the chip #0. The address conversion circuit #1 corresponding to the PLANE1 of the chip #0 executes an address conversion operation of converting each of the block addresses to be sent to the PLANE1 of the chip #0 into another block address based on the mathematical rule indicated by the address conversion rule #1 corresponding to the PLANE1 of the chip #0.

Similarly, the address conversion circuit #14 corresponding to the PLANE0 of the chip #7 executes an address conversion operation of converting each of the block addresses to be sent to the PLANE0 of the chip #7 into another block address based on the mathematical rule indicated by the address conversion rule #14 corresponding to the PLANE0 of the chip #7. The address conversion circuit #15 corresponding to the PLANE1 of the chip #7 executes an address conversion operation of converting each of the block addresses to be sent to the PLANE1 of the chip #7 into another block address based on the mathematical rule indicated by the address conversion rule #15 corresponding to the PLANE1 of the chip #7.

FIG. 12 illustrates another example of the relationship between a plurality of address conversion circuits 151 and a plurality of NAND flash memory chips included in the controller 4 of the flash storage device 3.

This case is based on the assumption that each of the plurality of address conversion circuits 151 is supplied with a super block address indicating a super block to be accessed.

In this case, each of the address conversion circuits 151 may include an address conversion circuit 151a and a block address conversion circuit 151b provided in a stage preceding the address conversion circuit 151a as illustrated in FIG. 13. For example, the address conversion circuit 151a of an address conversion circuit 151 (address conversion circuit #0) corresponding to the chip #0 converts each of the block addresses to be sent to the chip #0 based on the mathematical rule indicated by the address conversion rule #0 corresponding to the chip #0. The block address conversion circuit 151b of the address conversion circuit 151 (address conversion circuit #0) corresponding to the chip #0 converts a specific super block address indicating the super block to be accessed into a specific block address specifying a specific block in the chip #0. In the present embodiment, each of the block addresses of the blocks belonging to one super block is determined based on the specific mathematical rule from the super block address of this super block. Therefore, the conversion from the specific super block address into a specific block address by the block address conversion circuit 151b can be executed based on this specific mathematical rule. When each of the super blocks is formed from an aggregate of blocks with the same block address (block number) as the super block address (super block number) of this super block, the specific block address coincides with the specific super block address and thus there is no need to provide the block address conversion circuit 151b.

The configuration illustrated in FIG. 12 for supplying the super block addresses to each of the plurality of address conversion circuits 151 is also applicable to the configuration illustrated in FIG. 11 including the plurality of address conversion circuits 151 corresponding to the plurality of planes.

As described above, according to the present embodiment, the address conversion operation of converting each of the block addresses to be sent to each of the nonvolatile memory chips (or the planes) is executed by the address conversion circuits 151 based on the respective mathematical rules in the plurality of address conversion rules prescribed such that the number of defective blocks included in each of the plurality of parallel access units (super blocks) is equal to or smaller than a threshold (first number). Therefore, the relationship between the super blocks and the set of blocks belonging to each of the super blocks can be changed without using a table of management information. Accordingly, the numbers of defective blocks included in the super blocks can be almost unified among the super blocks. Accordingly, it is possible to control the aggregates of blocks to be accessed in parallel at low cost in an efficient manner.

The configuration of the flash storage device 3 in the present embodiment is also applicable to various types of storage devices including type #1 and type #2 described below.

<Type #1 Storage Device>

A type #1 storage device is configured to receive a read/write command specifying a logical address such as LBA from the host 2. The read/write command specifies the logical address and the data length but does not specify the physical address of the NAND flash memory 5. When the flash storage device 3 is implemented as a type #1 storage device, the write control unit 21 illustrated in FIG. 1 writes data received from the host 2 (write data) into a usable physical storage location of the write destination super block in response to the write command received from the host 2. Then, the write control unit 21 illustrated in FIG. 1 updates the LUT 32 to map the physical address indicating the physical storage location into which the write data is written to the logical address of the write data. When the read control unit 22 illustrated in FIG. 1 receives a read command from the host 2, the read control unit 22 refers to the LUT 32 to acquire the physical address corresponding to the logical address specified by the read command. Then, the read control unit 22 reads the data from the physical storage location in the NAND flash memory 5 specified by the physical address.

<Type #2 Storage Device>

A type #2 storage device is configured to receive a read/write command specifying the physical address of the NAND flash memory 5 from the host 2. When the flash storage device 3 is implemented as a type #2 storage device, a logical-physical address translation table for managing mapping between the logical addresses and the physical addresses of the NAND flash memory 5 is provided in the host 2.

The write control unit 21 illustrated in FIG. 1 receives a write command specifying the block address and the logical address from the host 2. The logical address is an identifier for identifying the data to be written (write data), and may be LBA, a key of key value store, or a hash value of the key, for example. Upon receipt of the write command, the write control unit 21 first determines a location (write destination location) in the block (write destination block) having the specified block address, into which the write data from the host 2 is to be written. Then, the write control unit 21 writes the write data from the host 2 into the write destination location in the write destination block. In this case, the write control unit 21 can write not only the write data but also both the write data and the logical address of the write data into the write destination block.

Then, the write control unit 21 notifies the host 2 of an in-block physical address indicating the write destination location in the write destination block. The in-block physical address is indicated by an in-block offset indicating the write destination location in the write destination block.

In this manner, the write control unit 21 determines by itself the write destination location in the block having the block address specified by the host 2 and writes the write data from the host 2 into the write destination location in this block. Then, the write control unit 21 notifies the host 2 of the in-block physical address (in-block offset) indicating the write destination location as a response (return value) to the write request. Alternatively, the write control unit 21 may notify the host 2 of not only the in-block physical address (in-block offset) but also a set of the logical address, the block address, and the in-block physical address (in-block offset).

Therefore, the flash storage device 3 can conceal restrictions on page write order, bad pages, page size, and others while causing the host 2 to handle the block address.

As a result, the host 2 can recognize the block boundaries, and manage which user data exists in which block without considering the restrictions on page write order, the bad page, and the page size.

The block address specified by the write command received from the host 2 may be a block address of a physical block or may be a block address of a super block (super block address).

When the flash storage device 3 is implemented as a type #2 storage device, the read control unit 22 illustrated in FIG. 1 receives a read request (read command) specifying the physical address (that is, the block address and the in-block offset) from the host 2. Upon receipt of the read command from the host 2, the read control unit 22 reads the data from a read target physical storage location in a read target block, based on the block address and the in-block offset. The read target block is identified by the block address (block number). The read target physical storage location in the block is identified by the in-block offset.

The block address specified by the read command received from the host 2 may be a block address of a physical block or may be a block address of a super block (super block address).

In a case where the block address specified by a read/write command is a block address of a physical block, the block address may be expressed by a combination of chip address (chip number) and block address (block number) or may be expressed by a combination of chip address (chip number), plane number, and block address (block number).

In another embodiment, the address conversion circuit 151 may be implemented by an ALU in a CPU 12, for example.

In the present embodiment, the nonvolatile memory is an NAND flash memory as an example. However, the functions of the present embodiment are also applicable to various other nonvolatile memories such as magnetoresistive random access memory (MRAM), phase change random access memory (PRAM), resistive random access memory (ReRAM), or ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a plurality of nonvolatile memory chips each of which includes a plurality of blocks; and
    a controller electrically connected to the plurality of nonvolatile memory chips and configured to control a plurality of parallel access units, each of the plurality of parallel access units being a unit of each of a data write operation and a data read operation, each of the plurality of parallel access units including a plurality of blocks which are respectively selected from the plurality of nonvolatile memory chips, block addresses of the plurality of blocks included in each of the plurality of parallel access units being determined on the basis of a mathematical rule from an address for identifying each of the parallel access units, wherein
    the memory system stores information indicating a plurality of address conversion rules respectively corresponding to the plurality of nonvolatile memory chips, the plurality of address conversion rules being determined on the basis of a pattern of defective blocks included in the plurality of nonvolatile memory chips such that a number of the defective blocks included in each of the plurality of parallel access units is equal to or smaller than a first number, each of the plurality of address conversion rules indicating a mathematical rule for converting block addresses to be sent to each of the plurality of nonvolatile memory chips into other block addresses,
    the controller includes an address conversion circuit configured to execute a plurality of address conversion operations respectively corresponding to the plurality of nonvolatile memory chips on the basis of the mathematical rules of the plurality of address conversion rules, each of the plurality of address conversion operations converting the block addresses to be sent to each of the plurality of nonvolatile memory chips into the other block addresses, the other block addresses being sent to each of the plurality of nonvolatile memory chips, in a first nonvolatile memory chip among the plurality of nonvolatile memory chips, block addresses to be sent to the first nonvolatile memory chip are converted on the basis of a first mathematical rule of a first address conversion rule corresponding to the first nonvolatile memory chip such that a defective block included in a first parallel access unit among the plurality of parallel access units is treated as a block of a second parallel access unit among the plurality of parallel access units, in a second nonvolatile memory chip among the plurality of nonvolatile memory chips, block addresses to be sent to the second nonvolatile memory chip are converted on the basis of a second mathematical rule of a second address conversion rule corresponding to the second nonvolatile memory chip such that a defective block included in the first parallel access unit is treated as a block of a third parallel access unit among the plurality of parallel access units.

2. The memory system according to claim 1, wherein the first number is set to an integer equal to or smaller than an average of the numbers of the defective blocks included in the plurality of nonvolatile memory chips.

3. The memory system according to claim 1, wherein the address conversion circuit includes a plurality of address conversion circuits corresponding to the plurality of nonvolatile memory chips, each of the address conversion circuits being configured to execute an address conversion operation of converting each of the block addresses to be sent to one nonvolatile memory chip into another block address based on the mathematical rule in the corresponding address conversion rule.

4. The memory system according to claim 1, wherein each of the address conversion rules indicates any one or a combination of any two or more of (1) an addition of any integer to a block address to be sent to each of the plurality of nonvolatile memory chips, (2) a subtraction of any integer from the block address, (3) a subtraction of the block address from a maximum block address corresponding to each of the plurality of nonvolatile memory chips, and (4) an inversion of some or all of a plurality of bits indicating the block address.

5. The memory system according to claim 1, wherein the information is permanently stored in the memory system.

6. The memory system according to claim 1, wherein the information is permanently stored in at least one of the nonvolatile memory chips or another nonvolatile memory included in the memory system.

7. A memory system comprising:

a plurality of nonvolatile memory chips each of which includes a plurality of planes, each of the plurality of planes including a plurality of blocks; and a controller electrically connected to the plurality of nonvolatile memory chips and configured to control a plurality of parallel access units, each of the plurality of parallel access units being a unit of each of a data write operation and a data read operation, each of the plurality of parallel access units including a plurality of blocks which are respectively selected from a plurality of planes included in the plurality of nonvolatile memory chips, block addresses of the plurality of blocks included in each of the plurality of parallel access units being determined on the basis of a mathematical rule from an address for identifying each of the parallel access units, wherein the memory system stores information indicating a plurality of address conversion rules respectively corresponding to the plurality of planes included in the plurality of nonvolatile memory chips, the plurality of address conversion rules being determined on the basis of a pattern of defective blocks included in the plurality of planes included in the plurality of nonvolatile memory chips such that a number of the defective blocks included in each of the plurality of parallel access units is equal to or smaller than a first number, each of the plurality of address conversion rules indicating a mathematical rule for converting block addresses be sent to each of the plurality of planes of the plurality of nonvolatile memory chips into other block addresses, the controller includes an address conversion circuit configured to execute a plurality of address conversion operations respectively corresponding to the plurality of planes of the plurality of nonvolatile memory chips on the basis of the mathematical rules of the plurality of address conversion rules, each of the plurality of address conversion operations converting the block addresses to be sent to each of the plurality of planes of the plurality of nonvolatile memory chips into the other block addresses, the other block addresses being sent to each of the plurality of planes of the plurality of nonvolatile memory chips, in a first plane among the plurality of planes of the plurality of nonvolatile memory chips, block addresses to be sent to the first plane are converted on the basis of a first mathematical rule of a first address conversion rule corresponding to the first plane such that a defective block included in a first parallel access unit among the plurality of parallel access units is treated as a block of a second parallel access unit among the plurality of parallel access units, in a second plane among the plurality of planes of the plurality of nonvolatile memory chips, block addresses to be sent to the second plane are converted on the basis of a second mathematical rule of a second address conversion rule corresponding to the second plane such that a defective block included in the first parallel access unit is treated as a block of a third parallel access unit among the plurality of parallel access units.

8. The memory system according to claim 7, wherein the first number is set to an integer equal to or smaller than an average of the numbers of the defective blocks included in the plurality of planes of the plurality of nonvolatile memory chips.

9. The memory system according to claim 7, wherein the address conversion circuit includes a plurality of address conversion circuits corresponding to the plurality of planes of the plurality of nonvolatile memory chips, each of the address conversion circuits being configured to execute an address conversion operation of converting each of the block addresses to be sent to one plane into another block address based on the mathematical rule in the corresponding address conversion rule.

10. The memory system according to claim 7, wherein each of the address conversion rules indicates any one or a combination of any two or more of (1) an addition of any integer to a block address to be sent to each of the plurality of planes of the plurality of nonvolatile memory chips, (2) a subtraction of any integer from the block address, (3) a subtraction of the block address from a maximum block address corresponding to each of the plurality of planes of the plurality of nonvolatile memory chips, and (4) an inversion of some or all of a plurality of bits indicating the block address.

11. The memory system according to claim 7, wherein the information is permanently stored in the memory system.

12. The memory system according to claim 7, wherein the information is permanently stored in at least one of the nonvolatile memory chips or another nonvolatile memory included in the memory system.

* * * * *